US005200655A

United States Patent [19]

Feldt

[11] Patent Number: 5,200,655

[45] Date of Patent: Apr. 6, 1993

[54] TEMPERATURE-INDEPENDENT EXPONENTIAL CONVERTER

[75] Inventor: Daniel C. Feldt, Streamwood, Ill.

[73] Assignee: Motorola, Inc., Schaumburg, Ill.

[21] Appl. No.: 709,739

[22] Filed: Jun. 3, 1991

[51] Int. Cl.⁵ .......................... G06G 7/24; H01L 31/00

[52] U.S. Cl. .......................... 307/492; 307/491; 307/310; 328/142; 328/145

[58] Field of Search .......................... 307/310, 491, 492; 328/142-145

[56] References Cited

U.S. PATENT DOCUMENTS 3,329,836 7/1967 Pearlman et al. .................... 307/310
3,444,362 5/1969 Pearlman .................... 307/310
3,612,902 10/1971 Moose .................... 328/145
3,790,819 2/1974 Chamran .................... 307/310
3,992,622 11/1976 Numata et al. .................... 328/145
4,168,492 9/1979 Uya .................... 307/310
4,333,023 6/1982 Hood, Jr. .................... 328/145
4,604,532 8/1986 Gilbert .................... 328/145
4,692,025 9/1987 Tani et al. .................... 328/145
4,786,970 11/1988 Moore .................... 307/310
4,983,863 1/1991 Tanno .................... 307/492
5,065,053 11/1991 Chan et al. .................... 328/145
5,081,378 1/1992 Watanabe .................... 307/492
5,126,846 6/1992 Niimura .................... 328/145

*Primary Examiner*—William L. Sikes
*Assistant Examiner*—Terry D. Cunningham
*Attorney, Agent, or Firm*—Robert H. Kelly

[57] ABSTRACT

A linear-to-exponential converter circuit for generating a temperature-independent signal which is exponentially related to an input signal. An amplifier stage forming an exponential multiplier is comprised of a bipolar junction transistor which, characteristic of bipolar junction transistors, generates a current at a collector electrode which is dependent upon temperature. A signal to be amplified by the expontential multiplier formed of the bipolar junction transistor is first provided to a temperature compensation circuit. The temperature compensation circuit introduces a temperature dependency upon the input signal which is the inverse to that of the temperature dependency of the bipolar junction transistor of the amplification circuit. The temperature dependency of the amplified signal is removed, and a temperature-invariant signal is produced thereby.

8 Claims, 5 Drawing Sheets

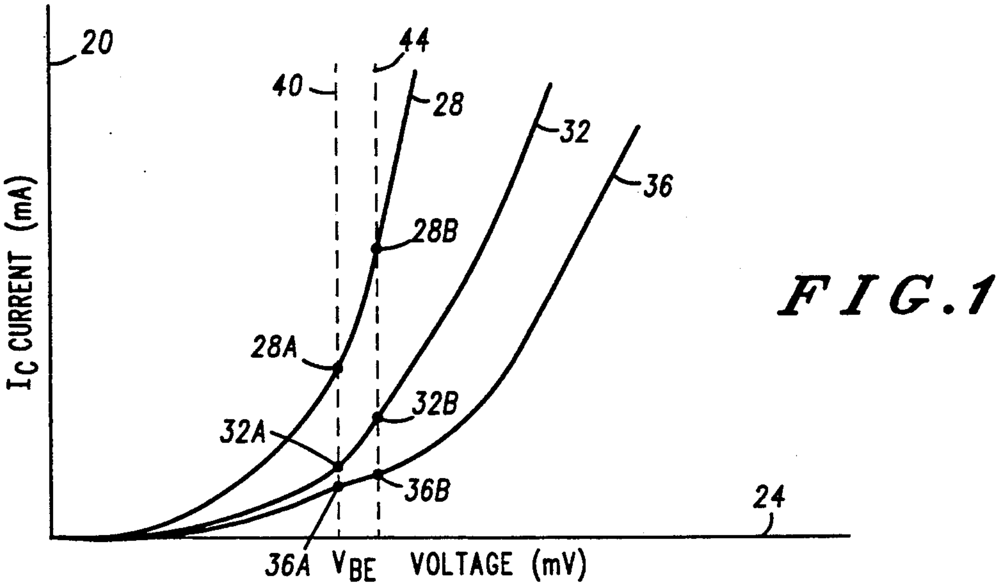
FIG.1
FIG.3
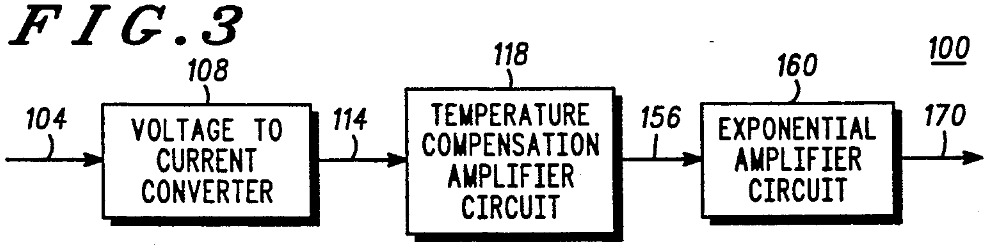
FIG.2
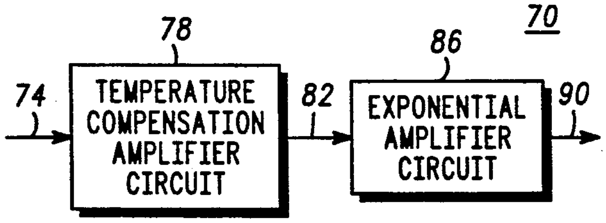
FIG.4
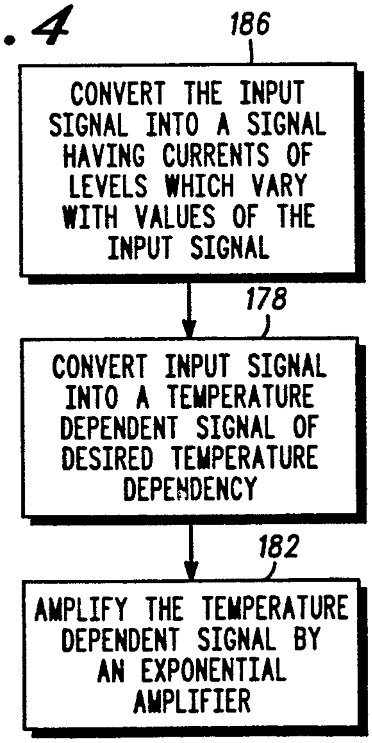
FIG.9
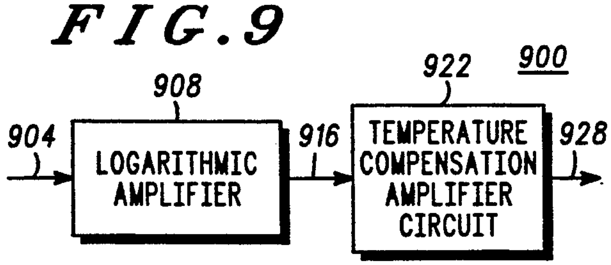

400

TEMPERATURE-INDEPENDENT EXPONENTIAL CONVERTER

BACKGROUND OF THE INVENTION

The present invention relates generally to exponential converter circuitry, and, more particularly, to a temperature-independent exponential converter capable of generating a temperature-independent signal which is exponentially related to an input signal applied thereto.

Many types of circuitry utilize exponential circuitry to generate a signal which is exponentially related to an input signal applied thereto. For instance, circuitry forming portions of components of a communication system constitutes one such type of circuitry which advantageously utilizes such exponential circuitry. Typically, when exponential circuitry forms portions of such communication components, the exponential circuitry is utilized to convert linear-scaled signals into decibel-scaled signals. (A decibel is a value related to an exponential value.)

A transmitter and a receiver comprise the component portions of a communication system. The transmitter and the receiver are interconnected by a transmission channel, and an information signal is transmitted by the transmitter upon the transmission channel to the receiver which receives the transmitted, information signal.

A radio communication system comprises a communication system wherein the transmission channel is formed of a radio-frequency communication channel. The radio-frequency communication channel is defined by a range of frequencies of the electromagnetic frequency spectrum. To transmit an information signal upon the radio-frequency communication channel, the information signal must be converted into a form suitable for transmission thereof upon the radio-frequency channel.

Conversion of the information signal into a form suitable for transmission thereof upon the radio-frequency communication channel is accomplished by a process referred to as modulation wherein the information signal is impressed upon a radio-frequency electromagnetic wave. The radio-frequency electromagnetic wave is of a value within a range of frequencies of the frequencies which define the radio-frequency communication channel. The radio-frequency electromagnetic wave upon which the information signal is impressed is commonly referred to as a "carrier signal", and the radio-frequency electromagnetic wave, once modulated by the information signal, is referred to as a modulated signal.

The information content of the modulated signal occupies a range of frequencies, sometimes referred to as the modulation spectrum. The range of frequencies which comprise the modulation spectrum include the frequency of the carrier signal. Because the modulated signal may be transmitted through free space upon the radio-frequency channel to transmit thereby the information signal between the transmitter and the receiver of the radio communication system, the transmitter and the receiver portions of the communication system need not be positioned in close proximity with one another. As a result, radio communication systems are widely utilized to effectuate communication between a transmitter and a remotely-positioned receiver.

Various modulation techniques have been developed to modulate the information signal upon the carrier signal to form the modulated signal, thereby to permit the transmission of the information signal between the transmitter and the receiver of the radio communication system. Such modulation techniques include, for example, amplitude modulation (AM), frequency modulation (FM), phase modulation (PM), frequency-shift keying modulation (FSK), phase-shift keying modulation (PSK), and continuous phase modulation (CPM). One type of continuous phase modulation is quadrature amplitude modulation (QAM).

The receiver of the radio communication system which receives the modulated signal contains circuitry to detect, or to recreate otherwise, the information signal modulated upon the carrier signal. The circuitry of the receiver typically includes circuitry to convert downward in frequency the modulated signal received by the receiver in addition to the circuitry required to detect the information signal. The process of detecting or recreating the information signal from the modulated signal is referred to as demodulation, and such circuitry for performing the demodulation is referred to as demodulation circuitry.

In some receiver constructions, circuitry including a processor (referred to as a digital signal processor or a DSP) is substituted for conventional demodulation circuitry.

The signal actually received by the receiver of a radio communication system frequently varies in magnitude as a result of reflection of the transmitted signal prior to reception by the receiver. Typically, the signal actually received by the receiver is the summation of the transmitted signal which travels along a plurality of different paths forming signal paths of differing path lengths. Because the transmission channel upon which the modulated signal is transmitted typically includes a plurality of different signal paths, a transmission channel is frequently referred to as a multi-path channel. Transmission of the signal upon signal paths of path lengths greater than the path length of a direct path results in signal delay as the summation of the transmitted signal upon the multi-path channel is actually a summation of signal transmitted by a transmitter and received by the receiver at different points in time.

Such signal delay results in interference referred to as Rayleigh fading and intersymbol interference. Such interference causes signal amplitude variance of the signal received by the receiver. When the communication system, formed of a transmitter and receiver, comprises a transmitter and receiver of a mobile communication system (such as a cellular telephone system), when a receiver is positioned in a vehicle traveling at 60 MPH, the signal strength of a modulated signal transmitted by the transmitter, and actually received by the receiver, may vary by approximately 20 decibels during a five millisecond period.

Gain control circuitry oftentimes forms a portion of the receiver circuitry alternately to amplify the received signal and limit the magnitude of the received signal to overcome the effects of such fading.

Gain control circuitry typically utilizes signals which are scaled in terms of decibels per volt. As a decibel is a logarithmic value, exponential conversion circuitry also typically forms a portion of the gain control circuitry of the receiver circuitry.

Existing exponential conversion circuitry is available which is operative to form an exponential output signal responsive to application of a linear input signal thereto.

For instance, disclosed in a text entitled, "IC Op-Amp Cookbook," by Howard W. Sams, copyright 1974, pages 214–216 is an antilog generator for forming an exponential signal responsive to application of a signal thereto. The antilog generator is comprised of discrete components.

Also, an integrated circuit, INTERSIL Part No. ICL8049, discloses a similar such structure in integrated circuit form. Additionally, an integrated circuit, INTERSIL Part No. ICL8048, discloses a logarithmic converter for performing a logarithmic conversion.

The existing circuitry for generating an exponential signal responsive to application of an input signal thereto forms an exponential signal which is temperature-dependent. The actual signal generated by such circuitry is therefore temperature-dependent, viz., the actual, exponential signals generated by such circuitry are of values which vary corresponding to the temperature of the circuitry. Therefore, the signals generated by such existing circuitry are not dependent solely upon the values of the signals supplied thereto, but also upon temperature.

While both the antilog generator and the integrated circuit equivalents thereof attempt to provide temperature-compensation to minimize the dependence of the signal formed by the circuitry upon temperature, such attempts may not totally cancel the temperature-dependency of the signal.

The antilog generator disclosed by Sams includes a discrete thermistor. As the temperature of the thermistor is not necessarily equal to that of the amplifier of the antilog generator, the attempt to compensate for the temperature-dependency of the signal is frequently inadequate.

The antilog generator disposed upon the integrated circuit attempts to compensate for the temperature-dependency of the signal generated therefrom by forming the integrated circuit by a hybrid production process. An integrated circuit formed of a hybrid production process is of at least two different types of materials. Such a process increases production costs as well as material costs, and, in any event, the temperature-compensation circuitry of such integrated circuits again may not totally cancel the temperature-dependency. The attempt to compensate for the temperature-dependency in this manner is, therefore, frequently inadequate.

Accordingly, gain control circuitry of receiver components of a radio communication system which utilizes such conventional exponential conversion circuitry generates signals which vary corresponding to the temperature level of the circuitry. Therefore, gain control signals generated by such gain control circuitry are, at least in part, variable responsive to temperature levels. As such temperature dependency adversely affects the functioning of the receiver gain control circuitry, the resultant gain control of a received signal is subject to error.

What is needed, therefore, is exponential conversion circuitry which generates an exponential signal which is temperature-independent.

SUMMARY OF THE INVENTION

The present invention, therefore, advantageously provides a circuit for generating a temperature-independent signal which is exponentially related to an input signal.

The present invention further advantageously provides a method for generating a temperature-independent signal which is exponentially related to an input signal.

The present invention yet further advantageously provides exponential converter for a gain control circuit of a radio receiver which generates a temperature-independent bias current which is exponentially related to a control voltage.

The present invention still further advantageously provides a circuit for generating a signal which is logarithmically related to an input signal.

The present invention provides further advantages and features, details of which will become more apparent by reading the detailed description of the preferred embodiments hereinbelow.

In accordance with the present invention, therefore, a circuit for generating a temperature-independent signal which is exponentially related to an input signal is disclosed. The circuit converts the input signal into a temperature-dependent signal of a desired temperature dependency. An exponential amplifier amplifies the temperature-dependent signal responsive to application of the temperature-dependent signal thereto. The exponential amplifier has a temperature dependency corresponding to, and inverse of, the temperature dependency of the temperature-dependent signal such that an amplified signal formed thereby forms the temperature-independent signal which is exponentially related to the input signal.

BRIEF DESCRIPTION OF THE DRAWINGS

The present invention will be better understood when read in light of the accompanying drawings in which:

FIG. 1 is a graphical representation of the current generated at the collector electrode of a bipolar junction transistor plotted as a function of the base-to-emitter voltage thereof at three different ambient temperature levels;

FIG. 2 is a simplified, block diagram of the circuit of a first preferred embodiment of the present invention;

FIG. 3 is a block diagram, similar to that of FIG. 2, but of an alternate preferred embodiment of the present invention;

FIG. 4 is a flow diagram listing the method steps of the method of a preferred embodiment of the method of the present invention;

FIG. 9 is a block diagram of another alternate, preferred embodiment of the present invention which forms a temperature-independent, logarithmic signal;

DESCRIPTION OF THE PREFERRED EMBODIMENTS

Figure 5:
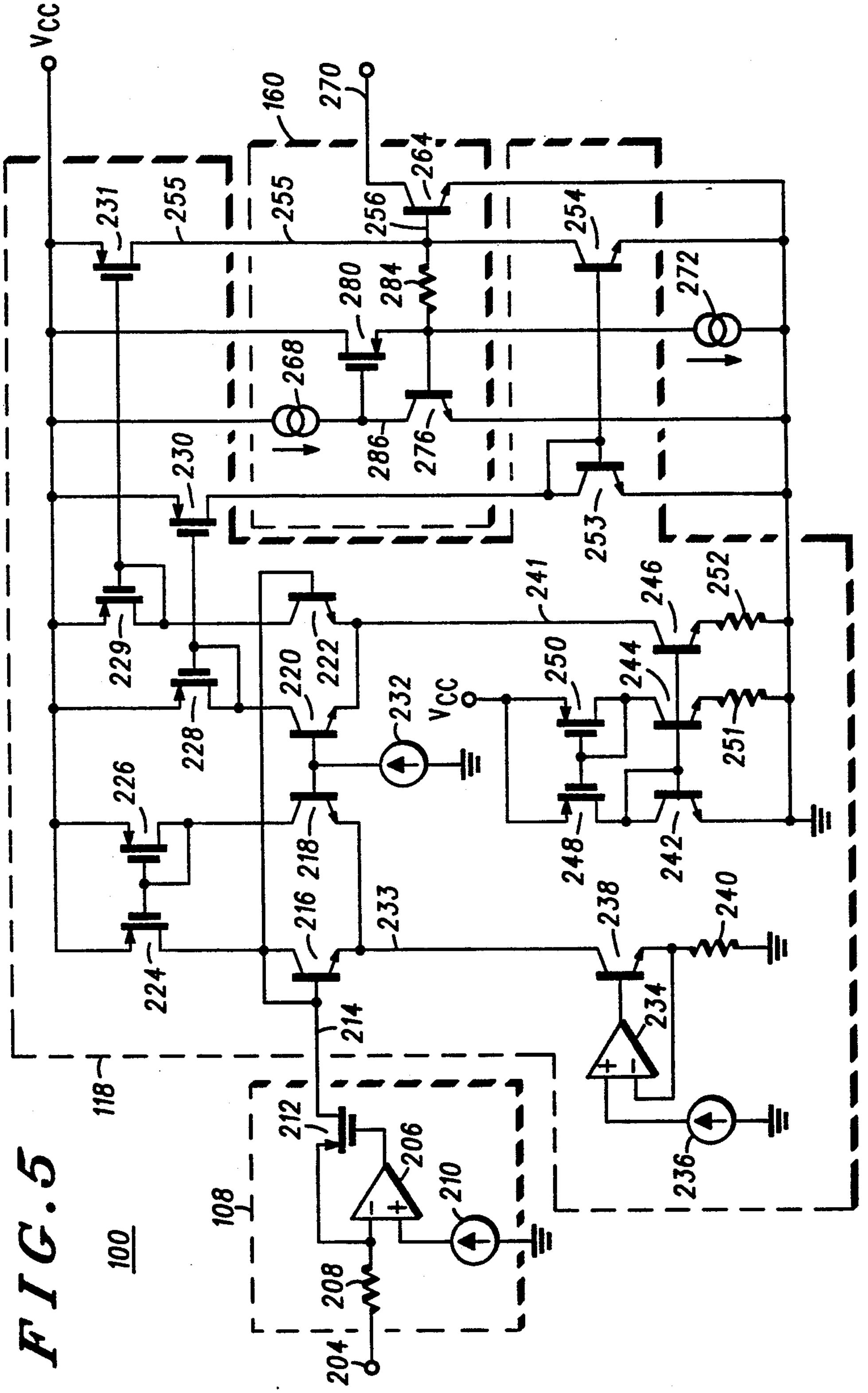
FIG. 5 is a simplified circuit diagram of an implementation of the preferred embodiment of FIG. 3.

Turning first to the graphical representation of FIG. 1, the current generated at the collector electrode of a bipolar junction transistor is plotted as a function of the potential difference across the base and the emitter electrodes, $V_{BE}$, of the bipolar junction transistor. The collector current, $I_c$, scaled in terms of milliamperes, is plotted upon ordinate axis 20 as a function of the base to emitter voltage, $V_{BE}$, scaled in terms of millivolts on abscissa axis 24.

Plots 28, 32, and 36 represent the relationship between the current at the collector electrode and the voltage across the base-to-emitter electrodes of the bipolar junction transistor at three different temperatures—$T_2$, $T_1$, and $T_0$, respectively, wherein $T_2 > T_1 > T_0$. Examination of plots 28, 32, and 36 indicates that the current at a collector electrode, $I_c$, of a bipolar junction transistor is dependent not only upon the base-to-emitter voltage, $V_{BE}$, but also upon the temperature of the transistor. For instance, at a particular base-to-emitter voltage, indicated in the Figure by vertically-extending line 40 shown in hatch, the current at the collector electrode of the transistor will be dependent upon the temperature of the transistor. At temperature $T_2$, the current $I_c$ at the indicated base-to-emitter voltage is indicated on the curve by point 28A. At temperature $T_1$, the current $I_c$ at the indicated base-to-emitter voltage is indicated by point 32A, and at temperature $T_0$, the current $I_c$ at the indicated base-to-emitter voltage, $V_{BE}$, is indicated by point 36A.

Similarly, for a larger base-to-emitter voltage, $V_{BE}$, indicated in the Figure by vertically extending line 44 shown in hatch, at temperature $T_2$, the current $I_c$ at the indicated base-to-emitter voltage is indicated on the curve by point 28B. At temperature $T_1$, the current $I_c$ at the indicated base-to-emitter voltage is indicated on the curve by point 32B, and at temperature $T_0$, the current $I_c$ at the indicated base-to-emitter voltage is indicated by point 36B.

Plots 28, 32, and 36 may be mathematically described by the following equation:

$$I_c = I_{sat}e^{V_{BE}q/kT)}$$

where:

- $I_c$ is the current level of the current at a collector electrode of a bipolar junction transistor;
- $I_{sat}$ is the saturation current characteristic of the bipolar junction transistor;
- e is the value 2.71 (wherein ln(e)=1);
- $V_{BE}$ is the voltage level taken across the base and emitter electrodes of the bipolar junction transistor;
- q is the charge of an electron;
- k is Boltzmann's constant; and
- T is the temperature of the bipolar junction transistor (scaled in terms of absolute degrees).

The above equation shows mathematically, and, plots 28–36 of FIG. 1 show graphically, the exponential relationship of the current at the collector electrode of the bipolar junction transistor with the base-to-emitter voltage, $V_{BE}$, of the transistor. The above equation also shows mathematically, and plots 28–36 of FIG. 1 also shows graphically, the temperature dependence of the current at the collector electrode of the transistor with the temperature thereof.

Because of this temperature dependency, the signals generated by conventional exponential circuitry require temperature compensation.

Turning now to FIG. 2, the circuit of a preferred embodiment of the present invention, referred to generally by reference numeral 70, is shown. Circuit 70 generates a temperature-independent signal which is exponentially related to an input signal.

An input signal formed on line 74 is supplied to temperature compensation amplifier circuit 78. Temperature compensation amplifier circuit 78 is operative to convert the input signal supplied thereto on line 74 into a temperature-dependent signal of a desired temperature dependency. With reference to the previously-listed mathematical equation used to describe the current at the collector electrode, $I_c$, amplifier circuit 78 is operative to introduce upon the signal supplied on line 74 a temperature dependency which is inverse that of the temperature dependency of the above-listed equation.

Temperature compensation amplifier circuit 78 generates a temperature-dependent signal on line 82 which is coupled to exponential amplifier circuit 86 to supply the temperature-dependent signal thereto. Exponential amplifier circuit 86 comprises at least one bipolar junction transistor which forms an exponential amplification circuit. Because, as previously described, the current at the collector electrode of the at least one bipolar junction transistor is exponentially related to the base-to-emitter voltage thereof, the current at the collector electrode forms an exponentially-amplified signal responsive to a signal applied to bias the base electrode thereof (here the signal supplied on line 82). A signal generated on line 90, which is appropriately coupled to the collector electrode of the bipolar junction transistor of amplifier circuit 86,is exponentially related to the input signal supplied on line 82. Because the temperature-dependent signal generated on line 82 is of a temperature dependency inverse to that of the temperature dependency of the at least one bipolar junction transistor, the signal generated on line 90 by circuit 86 is temperature-invariant.

Turning now to the block diagram of FIG. 3, a circuit, referred to generally by reference numeral 100, of an alternate preferred embodiment of the present invention is shown in functional block form. Similar to circuit 70 of FIG. 2, circuit 100 is operative to generate a temperature-independent signal which is exponentially related to an input signal supplied thereto. More particularly, circuit 100 of FIG. 3 is operative to receive a voltage signal which forms an input signal and to generate a temperature-independent current signal which is exponentially related to the voltage level of the voltage signal forming the input signal.

With reference, then, to the block diagram of FIG. 3, an input signal, formed of the voltage signal, is generated on line 104, and supplied to voltage-to-current converter circuit 108. Voltage-to-current converter circuit 108 converts the voltage signal supplied thereto on line 104 into a signal of a current of a level which varies responsive to the level of the voltage of the voltage signal forming the input signal. The current signal formed by converter 108 is generated on line 114 which is coupled to temperature compensation amplifier circuit 118 to supply the current signal thereto. Temperature compensation amplifier circuit 118, similar to temperature compensation amplifier circuit 78 of FIG. 2, is operative to introduce a desired temperature dependency upon the current signal supplied thereto on line 114, and to generate a temperature-dependent current signal on line 156.

Line 156 is coupled to exponential amplifier circuit 160. Exponential amplifier circuit 160, similar to exponential amplifier circuit 86 of FIG. 2, is operative to generate a signal, here on line 170, which is exponentially related to the signal supplied thereto on line 156.

Similar to exponential amplifier circuit 86 of FIG. 2, circuit 160 of FIG. 3 comprises at least one bipolar junction transistor which forms an exponential amplification circuit. The current at the collector electrode forms an exponentially-amplified signal responsive to a signal applied to bias the base electrode thereof (here, the signal supplied on line 156). Line 170 is appropriately coupled to the collector electrode of the transistor and the current at the collector electrode of the transistor, and the current at the collector electrode forms the output signal on line 170 which is exponentially-related to the input signal supplied on line 156. Similar to the relationship between temperature compensation amplifier circuit 78 and exponential amplifier circuit 86 of FIG. 2, temperature-compensation amplifier circuit 118 and exponential amplifier circuit 160 of FIG. 3 are interrelated in that the temperature-dependency introduced upon the signal supplied to circuit 118 on line 114 is inverse to that of the temperature dependency introduced upon the current generated at a collector electrode of the at least one bipolar junction transistor of exponential amplifier 160. Because the temperature-dependent signal generated on line 156 is of a temperature dependency inverse to that of the temperature dependency of the at least one bipolar junction transistor of circuit 160, the signal generated on line 170 by circuit 160 is temperature-invariant. Because of such temperature-invariance, the signal generated on line 170 does not vary responsive to changes in ambient temperature.

Turning now to the flow diagram of FIG. 4, the steps of the method of a preferred embodiment of the present invention are listed for generating a temperature-independent signal which is exponentially related to an input signal.

First, and as indicated by block 178, the input signal is converted into a temperature-dependent signal of a desired temperature dependency. With respect to the functional block diagrams of the preferred embodiments of FIGS. 2 and 3, temperature compensation amplifier circuits 78 and 118 of the respective figures are operative to perform such a step.

Next, and as indicated by block 182, the temperature-dependent signal is amplified by an exponential amplifier having a temperature dependency corresponding to, and inverse of, the temperature dependency of the temperature-dependent signal such that an amplified signal formed thereby forms the temperature-independent signal which is exponentially related to the input signal. With respect to the preferred embodiments of FIGS. 2 and 3, such step is performed by exponential amplifier circuits 86 and 160 of FIGS. 2 and 3, respectively.

In a preferred embodiment of the method of the present invention, the step of converting the input signal into a temperature-dependent signal comprises the step, indicated by block 186, of converting the input signal into a signal having currents of levels which vary responsive to values of the input signal. With respect to FIG. 3, such a step is performed by voltage-to-current converter 108.

FIG. 5 is a circuit diagram of circuit 100, which was previously shown in functional block form in FIG. 3. Voltage-to-current converter 108, temperature-compensation amplifier circuit 118, and exponential-amplifier circuit 160 illustrated in the functional block diagram of FIG. 3 are indicated in FIG. 5 by similarly-numbered blocks, shown in hatch. Line 204 of FIG. 5 corresponds to line 104 of FIG. 3, and supplies an input signal to voltage-to-current converter 108. Line 204 is coupled to a negative input of amplifier 206 through resistor 208. A DC voltage generated by voltage generator 210 is supplied to a positive input of amplifier 206. Metal oxide semiconductor field effect transistor (MOSFET) 212 interconnects an output of amplifier 206 and the negative input thereof. More particularly, and as illustrated, a gate electrode of MOSFET 212 is coupled to the output of the amplifier 206, a source electrode of MOSFET 212 is coupled to the negative input of amplifier 206, and a drain electrode of MOSFET 212 is coupled to line 214. The signal generated on line 214 is of a current level which varies in value corresponding to the variance in value of the voltage level of the input signal supplied on line 204. Line 214 of FIG. 5 corresponds to line 114 of the functional block diagram of FIG. 3.

Temperature compensation amplifier circuit 118, in the preferred embodiment of FIG. 5, is comprised of a predistortion/postdistortion amplifier and a band-gap current generator. The predistortion/postdistortion amplifier forming a portion of temperature compensation amplifier circuit 118 comprises bipolar junction transistors 216, 218, 220, and 222. Collector electrodes of the respective transistors 216–222 are coupled to drain electrodes of corresponding respective ones of MOSFETs 224, 226, 228, and 229. MOSFETs 224 and 226 are additionally coupled theretogether to form a current mirror. Similarly, MOSFET 228 is coupled to MOSFET 230 to form a current mirror, and MOSFET 229 is coupled to MOSFET 231 to form a current mirror.

Voltage source 232 biases the base electrodes of transistors 218 and 220.

The emitter electrodes of transistors 216 and 218 are coupled together by line 233. Line 233 is also coupled to an amplifier circuit comprised of amplifier 234 in which a voltage generated by voltage source 236 is supplied to a positive input thereof. An emitter electrode of transistor 238 is coupled to a negative input of amplifier 234. The emitter electrode of transistor 238, and the negative input to amplifier 234, are coupled to ground through resistor 240.

The emitter electrodes of transistors 220 and 222 are coupled together by line 241. Line 241 is also coupled to to the band-gap current generator comprised of transistors 242, 244, and 246. MOSFETs 248 and 250, also comprising a portion of the band-gap current generator, are coupled theretogether in a current mirror configuration. Drain electrodes of the respective MOSFETs 248 and 250 are coupled to the collector electrodes of transistors 242 and 244, respectively. Emitter electrodes of transistors 244 and 246 are coupled to ground through resistors 251 and 252, respectively.

The drain electrode of transistor 230 is coupled to the collector electrode of transistor 253 which, together with transistor 254, forms a current mirror.

A ratio formed of the current levels on lines 241 and 233 of the predistortion/postdistortion amplifier of temperature compensation amplifier circuit 118 forms the gain of the amplifier. The current level on line 241 is, however, dependent upon the current level of the band-gap current generator due to the connection of line 241 to the collector electrode of transistor 246. Therefore, the resultant gain of the predistortion/postdistortion amplifier is dependent upon the current level of the band-gap current generator. And, because the band gap-type current generator forms an output current at the collector electrode of transistor 246 which is temperature-dependent, the gain of the predistortion/postdistortion amplifier is therefore also dependent upon temperature.

The predistortion/postdistortion amplifier generates an amplified signal, formed of the summation of the current at the drain electrode of MOSFET 231 and the current at the collector electrode of transistor 254, responsive to application of the input signal supplied thereto on line 214. Because the gain of the amplifier is temperature-dependent, the amplified signal generated by the amplifier is temperature-dependent. This signal is coupled to node 256, and corresponds to the signal generated on line 156 of FIG. 3.

It is noted that the current at the collector electrode of transistor 220 is mirrored at the drain electrode of MOSFET 230, and is, in turn, mirrored at the collector electrode of transistor 254. Similarly, it is noted that the current generated at the collector electrode of transistor 222 is mirrored at the drain electrode of MOSFET 231.

Node 256 is also coupled to the base electrode of bipolar junction transistor 264. Transistor 264 forms the amplifier of exponential amplifier circuit 160. Line 270 is coupled to the collector electrode of transistor 264. The exponential amplifier circuit of the preferred embodiment of FIG. 5 further comprises current sources 268 and 272, bipolar junction transistor 276, MOSFET 280, and resistor 284. Line 286 interconnects current source 268 and the collector electrode of transistor 276.

Because transistor 264 is comprised of a bipolar junction transistor, the current generated at the collector electrode thereof is governed by the exponential, temperature-dependent relationship previously listed. Similarly, the current generated at the collector electrode of transistor 276 is governed by the same relationship.

A mathematical description of operation of circuit 160 follows.

The current at the collector electrodes of the transistors 276 and 264 may be represented as follows:

$$I_{c276}=I_{s276}\exp\left[V_{BE276}q/kT\right]$$

$$I_{c264}=I_{s264}\exp\left[V_{BE264}q/kT\right]$$

where:

- $I_{c276}$ is the current at the collector electrode of transistor 276;
- $I_{c264}$ is the current at the collector electrode of transistor 264;
- $I_{s276}$ and $I_{s264}$ are the saturation currents characteristic of the transistors 276 and 264;
- $V_{BE276}$ and $V_{BE264}$ are the base to emitter voltages of transistors 276 and 264, respectively;
- q is the charge of an electron;
- k is Boltzmann's constant; and
- T is the temperature of the bipolar junction transistor (scaled in terms of absolute degrees).

When transistors 264 and 276 are similarly constructed, the saturation current of the two transistors are essentially identical.

By forming a ratio of the current at the collector electrode of transistor 264, $I_{c264}$, to the current at the collector electrode of transistor 276, $I_{c276}$, and by algebraic simplification, the following equation may be obtained:

$$I_{c264}/I_{c276}=\exp[(V_{BE264}-V_{BE276})q/kT]$$

$V_{BE264}-V_{BE276}$ is merely the voltage drop across resistor 284, or $I_{256}\times R_{284}$ where $R_{284}$ is the resistance of resistor 284, and $I_{256}$ is the summation of the current at the drain electrode of MOSFET 231 and the current at the collector electrode of transistor 254.

By substitution, the following equation may be obtained:

$$I_{c264}/I_{c276}=\exp\left[I_{256}R_{284}q/kT\right]$$

Because the current at node 256, i.e., $I_{256}$, is directly proportional to the temperature, T, the temperature-dependency is cancelled at the collector electrode, and the ratio of the current at the collector electrode of transistor 264 and the current at the collector electrode of transistor 274 is temperature-invariant. Therefore, a ratio formed of the current levels of the the currents of lines 270 and 286 corresponds to line 170 of FIG. 3.

The exponential circuit of the present invention, as shown in FIG. 2 or FIGS. 3 and 5, may be advantageously utilized to form a portion of an automatic gain control circuit of a receiver, such as the receiver portion of a cellular radio telephone of a cellular communication system. Because the exponential circuit is temperature invariant, gain control of a signal received by the radio telephone does not vary responsive to temperature fluctuation.

Portions of a 100 megahertz frequency band extending between 800 megahertz and 900 megahertz are allocated in the United States for radio telephone communication, such as the radio telephone communication of a cellular, communication system. Conventionally, a radio telephone contains circuitry to permit simultaneous generation and reception of modulated signals, to permit thereby two-way communication between the radio telephone and a remotely-located transceiver.

Figure 6:
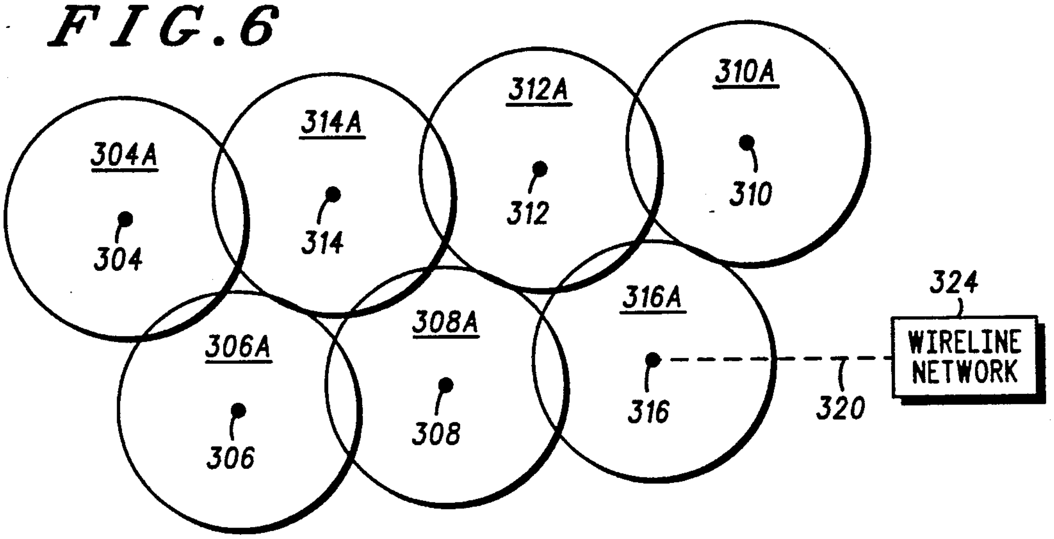
FIG. 6 is a schematic view of a portion of a cellular communication system.

Referring now to FIG. 6, a cellular, communication system is graphically shown. The cellular, communication system is formed by positioning numerous base stations at spaced-apart locations throughout a geographical area. The base stations are indicated in FIG. 6 by points 304, 306, 308, 310, 312, 314, and 316. While FIG. 6 illustrates six separate base stations, it is to be understood, of course, that an actual cellular, communication system is conventionally comprised of a large plurality of base stations. Each base station 304–316 contains circuitry to receive modulated signals transmitted by one, or many, radio telephones, and to transmit modulated signals to the one, or many, radio telephones. Each base station 304–316 is coupled to a conventional wireline, telephonic network. Such connection is represented in the figure by line 320, shown in hatch, interconnecting base station 316 and wireline network 324. Connections between wireline network 324 and other ones of the base stations 304–314 may be similarly shown.

The positioning of each of the base stations 304–316 forming the cellular, communication system is carefully selected to ensure that at least one base station is positioned to receive a modulated signal transmitted by a radio telephone positioned at any location throughout the geographical area. That is to say, at least one base station 304–316 must be within the transmission range of a radio telephone positioned at any such location throughout the geographical area. (Because the maximum signal strength, and hence, maximum transmission range, of a signal transmitted by a base station is typically greater than the maximum signal strength, and corresponding maximum transmission range, of a signal generated by a radio telephone, the maximum transmission range of a signal generated by a radio telephone is the primary factor which must be considered when positioning the base stations of the cellular communication system.)

Because of the spaced-apart nature of the positioning of the base stations, portions of the geographical area throughout which the base stations 304–316 are located are associated with individual ones of the base stations. Portions of the geographical area proximate to each of the spaced-apart base stations 304–316 define "cells" which are represented in the figure by areas 304A, 306A, 308A, 310A, 312A, 314A, and 316A surrounding the respective base stations 304–316. Cells 304A–316A together form the geographical area encompassed by the cellular, communication system. A radio telephone positioned within the boundaries of any of the cells of the cellular, communication system may transmit, and receive, modulated signals to, and from, at least one base station 304–316.

Figure 7:
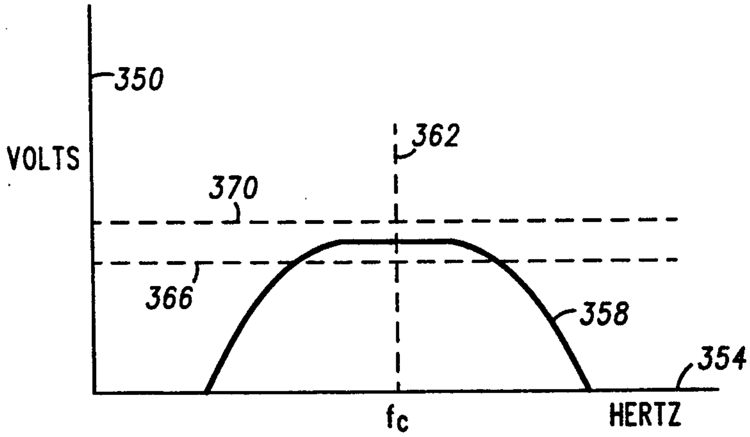
FIG. 7 is a graphical representation of a modulated signal plotted as a function of frequency.

Turning now to the graphical representation of FIG. 7, a signal transmitted upon a transmission channel, such as a transmission channel defined as a portion of the frequency band allocated for radio telephone communication, and received by a receiver, such as a radio telephone, is plotted as a function of frequency. The amplitude of the signal, scaled in terms of volts on ordinate axis 350, is graphed as a function of frequency, scaled in terms of hertz on abscissa 354. The energy of the received signal, indicated in the figure by wave form 358, is typically centered about a center frequency, $f_c$, of a particular frequency, and, as illustrated, is typically symmetrical about a line, here line 362, shown in hatch.

The signal received by the receiver is maintained within a desired range, and such range is represented in FIG. 4 by lines 366 and 370, shown in hatch. To maintain a signal level within such a range, the receiver typically includes gain control circuitry. The gain control circuitry amplifies the signal when the received signal is of too small of a signal level, and attenuates the signal when the signal is of too great of a signal level to maintain the received signal within a desired range. As mentioned previously, because gain control signals are typically scaled in terms of dB/volt, exponential conversion circuitry frequently forms a portion of gain control circuitry.

Figure 8:
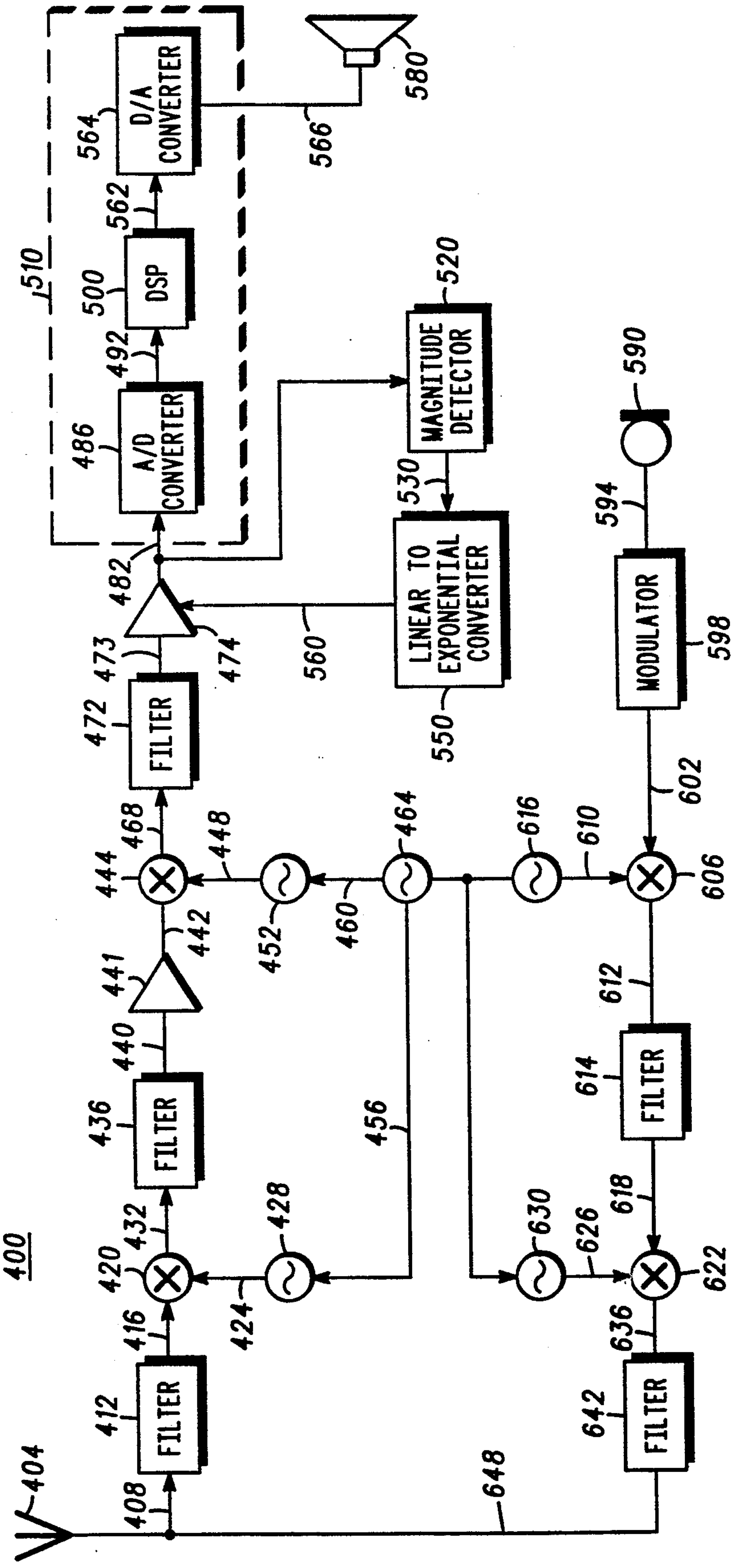
FIG. 8 is a block diagram of a radio transceiver having a receiver portion of which an exponential circuit of the present invention forms a portion thereof.

FIG. 8 illustrates a block diagram of a radio telephone, referred to generally by reference numeral 400, of the present invention. Radio telephone 400 includes the exponential conversion circuit 200 of FIG. 5. A signal transmitted to the radio telephone is received by antenna 404. Antenna 404 generates a signal on line 408 indicative of the received signal. Line 408 is coupled to filter circuit 412 which generates a filtered signal on line 416. A filtered signal generated on line 416 by filter 412 is supplied as an input to mixer circuit 420. Mixer 420 is also provided, as an input thereto, an oscillating frequency generated on line 424 by oscillator 428.

Mixer 420 generates a mixed signal on line 432 (sometimes referred to as a first down-converted signal) which is provided to filter 436. Filter 436 generates a filtered signal on line 440 which is supplied to amplifier 441. Amplifier 441 generates an amplified signal on line 442 which is supplied to mixer 444.

Mixer 444 additionally is provided, as an input thereto, an oscillating signal generated on line 448 by oscillator 452. As illustrated, oscillators 428 and 452 are coupled by lines 456 and 460, respectively, to reference oscillator 464 to lock the frequency of oscillators 428 and 452 in a desired relation with oscillator 464.

Mixer 444 generates a mixed signal (sometimes referred to as a second down-converted signal) on line 468 which is supplied to filter 472. Filter 472 generates a filtered signal on line 473 which is supplied to amplifier 474. Amplifier 474 generates an amplified signal on line 482 which is supplied to analog-to-digital converter 486. A/D converter 486 generates a signal on line 492 which is supplied to digital signal processor (DSP) 500.

The signal generated on line 482 is further supplied to magnitude detector 520 which detects the magnitude of the signal. Magnitude detector 520 generates a signal on line 530 which is supplied to exponential converter 550, which is similar in construction to circuit 100 of FIG. 5. Converter 550 generates a temperature-independent signal on line 560 which is indicative of the magnitude of the filtered signal generated on line 482. Line 560 is coupled to amplifier 474 which modifies the magnitude of the signal received thereat on line 473 responsive to the value of the signal on line 560. Gain control of the receiver circuitry of radio telephone 400 is thereby effectuated.

Because the exponential circuit 550 generates a signal which is not dependent upon temperature, variance of the amplitude of the signal generated by DSP 500 (or demodulator 510) is not dependent upon temperature.

DSP 500 generates a signal on line 562 which is supplied to digital-to-analog converter (D/A) 564. D/A converter 564 generates a signal on line 566 which is supplied to a transducer such as speaker 580. In some radio telephones, a conventional demodulator, represented in the figure by block 510, shown in hatch, is substituted for A/D converter 486, DSP 500, and D/A converter 564.

Radio telephone 400 of FIG. 8 further includes a transmitter portion comprising a transducer such as microphone 590 which generates an electrical signal on line 594 which is supplied to modulator 598. Modulator 598 generates a modulated signal on line 602 which is supplied to mixer 606. Mixer 606 is also provided, as an input thereto an oscillating signal generated on line 610 by oscillator 616.

Mixer 606 generates a mixed signal (sometimes referred to as a first up-converted signal) on line 612 which is supplied to filter 614. Filter 614 generates a filtered signal on line 618 which is supplied to second mixer circuit 622. Second mixer circuit 622 is also provided, as an input thereto, an oscillating signal generated on line 626 by oscillator 630. Oscillators 616 and 630 may, analogous to oscillators 428 and 452, be coupled to reference oscillator 464 to maintain the oscillating frequencies of signals generated by oscillators 616 and 630 in a desired frequency relationship with that of oscillator 464.

Mixer 622 generates a mixed signal (sometimes referred to as a second up-converted signal) on line 636 which is supplied to filter 642. Filter 642 generates a filtered signal on line 648 which may be coupled to antenna 404 to transmit the modulated, and up-converted, signal therefrom.

As a logarithmic function is merely the reverse of the exponential function, appropriate reversal of the operation of the present invention permits a temperature-independent signal which is logarithmically-related to an input signal applied thereto.

For instance, turning now to FIG. 9, then, the circuit of another alternate embodiment of the present invention, referred to generally by reference numeral 900, is shown. Circuit 900 generates a temperature-independent signal which is logarithmically related to an input signal.

An input signal formed on line 904 is applied to logarithmic amplifier circuit 908. Logarithmic amplifier circuit 908 comprises at least one bipolar junction transistor and is operative to form a signal which is logarithmically-related to an input signal applied thereto. As a bipolar junction transistor comprises a portion of circuit 908, the logarithmic signal generated thereby is a temperature-dependent signal.

The temperature-dependent signal formed by circuit 908 is generated on line 916 which is coupled to temperature compensation amplifier circuit 922. Amplifier circuit 922 is operative to convert the temperature-dependent, logarithmic signal applied thereto on line 916 into a temperature-independent signal which is logarithmically-related to the input signal. Amplifier circuit 922 is of a temperature dependency corresponding to, and inverse of, the temperature dependency of the temperature-dependent, logarithmic signal applied thereto on line 916.

Amplifier circuit 922 generates, on line 928, the temperature-independent signal which is logarithmically-related to the input signal.

Figure 10:
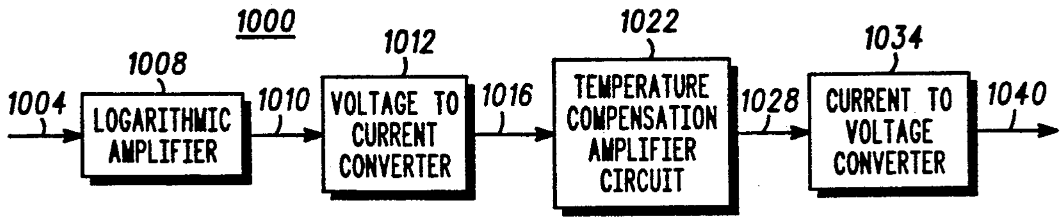
FIG. 10 is a block diagram of yet another alternate, preferred embodiment of the present invention which forms a temperature-independent, logarithmic signal.

FIG. 10 is a block diagram of another alternate embodiment of the present invention, referred to generally by reference numeral 1000. Circuit 1000 generates a temperature-independent voltage signal which is logarithmically related to an input current signal.

An input current signal formed on line 1004 is applied to logarithmic amplifier 1008. Logarithmic amplifier circuit 1008 comprises at least one bipolar junction transistor and is operative to form a signal which is logarithmically related to an input signal supplied thereto. As a bipolar junction transistor comprises a portion of circuit 1008, the logarithmic signal generated thereby is a temperature-dependent signal.

The temperature-dependent signal formed by circuit 1008 is generated on line 1010 which is coupled to voltage to current converter 1012. Voltage to current converter 1012 converts the signal applied thereto on line 1010 into a current signal having a current level varying according to the level of the signal applied on line 1010.

The current signal generated by converter 1012 is generated on line 1016 which is coupled to temperature compensation amplifier circuit 1022. Amplifier circuit 1022 is operative to convert the temperature-dependent, logarithmic signal applied thereto on line 1016 into a temperature-independent signal which is logarithmically related to the input signal. Amplifier circuit 1022 is of a temperature dependency corresponding to, and inverse of, the temperature dependency of the temperature-dependent, logarithmic signal applied thereto on line 1016.

Amplifier 1022 generates, on line 1028, a current signal which is applied to current to voltage converter 1034. Converter 1034 converts the signal applied thereto on line 1028 into a voltage signal having a voltage level varying according to the current level of the current signal supplied thereto on line 1028. Converter 1034 generates a voltage signal on line 1040 which is temperature independent, and logarithmically related to the input signal supplied on line 1004.

Figure 11:
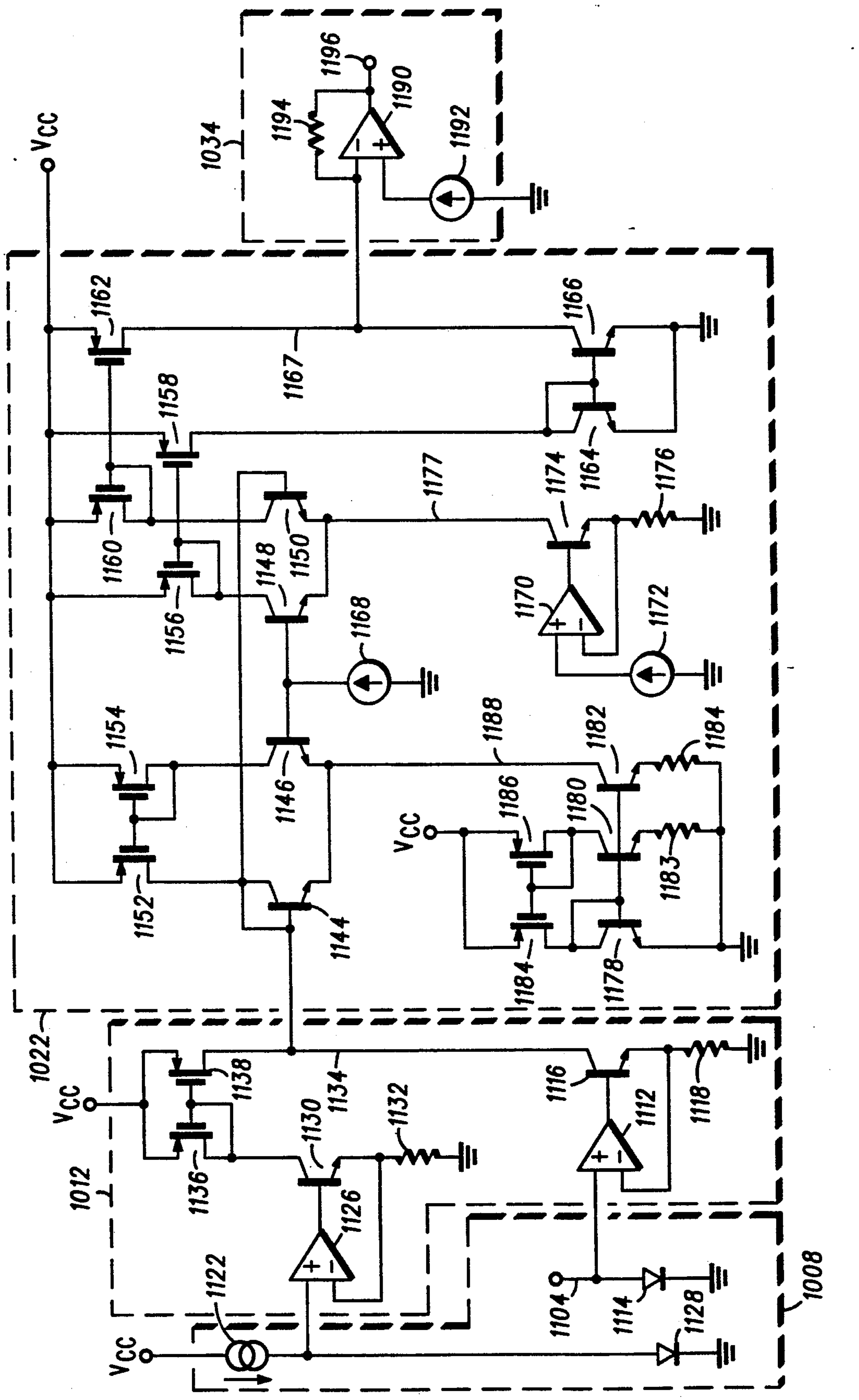
FIG. 11 is a simplified circuit diagram of the preferred embodiment of FIG. 10.

FIG. 11 is a circuit diagram of circuit 1000, which was previously shown in functional block form in FIG. 10. Logarithmic amplifier 1008, voltage to current converter 1012, temperature compensation amplifier circuit 1022, and current to voltage converter 1034 illustrated in the functional block diagram of FIG. 10 are indicated in FIG. 11 by similarly-numbered blocks, shown in hatch.

Line 1104, which is coupled to a positive input of amplifier 1112, corresponds to line 1004 of the functional block diagram of FIG. 10. Diode 1114 is additionally coupled between the positive input of amplifier 1112 and ground. A base electrode of transistor 1116 is coupled to an output of amplifier 1112, and an emitter electrode of transistor 1116 is coupled to ground through resistor 1118, as well as to a negative input of amplifier 1112.

Reference current generator 1122 is coupled to a positive input of amplifier 1126; additionally, diode 1128 is coupled between the positive input of amplifier 1126 and ground. A base electrode of transistor 1130 is coupled to an output of amplifier 1126, and an emitter electrode of transistor 1130 is coupled to ground through resistor 1132. The emitter electrode of transistor 1130 is additionally coupled to a negative input of amplifier 1126.

The current generated at the collector electrode of transistor 1130 is mirrored on line 1134 by a current mirror comprised of MOSFETS 1136 and 1138. Line 1134 is coupled at one end to a drain electrode of transistor 1138, and, at a second end thereof to a collector electrode of transistor 1116. Line 1134 corresponds to line 1016 of the functional block diagram of FIG. 10. Line 1134 is coupled to a base electrode of transistor 1144, as well as a base electrode of transistor 1150, a collector electrode of transistor 1144, and a drain electrode of MOSFET 1152.

Similar to the temperature-compensation amplifier circuit of FIG. 5, temperature compensation amplifier circuit 1022 of FIG. 11 is comprised of a predistortion/-postdistortion amplifier, and a band-gap current generator.

The predistortion/postdistortion amplifier is comprised of transistors 1144, 1146, 1148, and 1150, and current mirrors comprised of MOSFETS 1152 and 1154, 1156 and 1158, 1160 and 1162, and a current mirror comprised of bipolar junction transistors 1164 and 1166. Line 1167 connects the drain electrode of MOSFET 1162 with the collector electrode of transistor 1166. The base electrodes of transistors 1146 and 1148 are biased by voltage source 1168. The emitter electrodes of transistors 1148 and 1150 are coupled to an amplification circuit comprised of amplifier 1170 having a positive input thereof biased by voltage source 1172, and an output thereof coupled to transistor 1174 having an emitter electrode coupled to a negative input of the amplifier and coupled to ground through resistor 1176. Line 1177 couples the emitter electrodes of transistors 1148 and 1158 with the collector electrode of transistor 1174.

The band-gap type current generator is comprised of bipolar junction transistors 1178, 1180, and 1182, and a current mirror comprised of MOSFETS 1184 and 1186. The emitter electrodes of transistors 1180 and 1182 are coupled to ground through resistors 1183 and 1184. Line 1188 is coupled at one end thereof to the collector electrode of transistor 1182, and at a second end thereof to the emitter electrodes of transistors 1144 and 1146. Analogous to the temperature compensation amplifier circuit of FIG. 5 a ratio formed of the currents on lines 1177 and 1188 form the gain of the predistortion/post-distortion amplifier of the temperature compensation amplifier circuit 1022.

Current to voltage converter 1034 is formed of amplifier 1190 having a positive input thereof coupled to voltage source 1192, and a negative input thereof coupled to line 1167. Resistor 1194 interconnects the negative input terminal and the output terminal of amplifier 1190. A signal generated on line 1196 forms a voltage signal which is logarithmically-related to an input signal supplied on line 1104 to diode 1112.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A circuit for generating a temperature-independent signal which is exponentially related to an input signal, said circuit comprising:

a temperature-compensation amplifier having at least one band-gap current generator operative to generate a current of a value proportional to temperature, said temperature-compensation amplifier coupled to receive the input signal and operative to amplify the input signal and to generate thereby an amplified signal of a value proportional to temperature; and an exponential amplifier including at least one bipolar junction transistor having a base electrode, a collector electrode, and an emitter electrode, wherein the base electrode of the at least one bipolar junction transistor is coupled to receive the amplified signal of the value proportional to temperature generated by the temperature-compensation amplifier, and wherein the amplified signal is operative to bias the at least one bipolar junction transistor at a bias voltage of a value which is proportional to temperature whereby a current generated at the collector electrode of the at least one bipolar junction transistor is exponentially related to the bias voltage of the base electrode of the at least one bipolar junction transistor, and whereby the current generated at the collector electrode of the at least one bipolar junction transistor comprises the temperature-independent signal which is exponentially related to the input signal.

2. The circuit of claim 1 wherein the amplified signal of the value proportional to temperature generated by said temperature-compensation amplifier is directly proportional to temperature.

3. The circuit of claim 1 wherein said temperature-compensation amplifier comprises a predistortion/post-distortion amplifier.

4. An exponential converter for a gain control circuit of a radio receiver which generates a temperature-independent bias current which is exponentially related to a control voltage, said converter comprising:

a voltage-to-current converter coupled to receive the control voltage for converting the control voltage into a current signal having a current, the level of which varies responsive to values of the control voltage;

a temperature-compensation amplifier having at least one current source operative to generate a current of a value proportional to temperature, said temperature-compensation amplifier coupled to receive the current signal generated by the voltage-to-current converter, and operative to amplify the current signal and to generate thereby an amplified signal of a value proportional to temperature; and an exponential amplifier including at least one bipolar junction transistor having a base electrode, a collector electrode, and an emitter electrode, wherein the base electrode of the at least one bipolar junction transistor is coupled to receive the amplified signal of the value proportional to temperature generated by the temperature-compensation amplifier, and wherein the amplified signal is operative to bias the at least one bipolar junction transistor at a bias voltage of a value which is proportional to temperature whereby a current generated at the collector electrode of the at least one bipolar junction transistor is exponentially related to the bias voltage of the base electrode of the at least one bipolar junction transistor and whereby the current generated at the collector electrode of the at least one bipolar junction transistor forms the temperature-independent signal which is exponentially related to the input signal.

5. The circuit of claim 4 wherein the amplified signal of the value proportional to temperature generated by said temperature-compensation amplifier is directly proportional to temperature.

6. The exponential converter of claim 4 wherein said temperature-compensation amplifier comprises a current amplifier circuit.

7. The circuit of claim 4 wherein said temperature-compensation amplifier comprises a predistortion/post-distortion amplifier and a band-gap current generator coupled thereto.

8. A circuit for generating a temperature-independent signal which is exponentially related to an input signal, said circuit comprising:

a voltage-to-current converter coupled to receive the input signal for converting the input signal into a current signal having a current, the level of which varies responsive to values of the input signal;

a temperature-compensation amplifier having at least one current source operative to generate a current of a value proportional to temperature, said temperature-compensation amplifier coupled to receive the current signal generated by the voltage-to-current converter, and operative to amplify the current signal and to generate thereby an amplified signal of a value proportional to temperature; and an exponential amplifier including at least one bipolar junction transistor having a base electrode, a collector electrode, and an emitter electrode, wherein the base electrode of the at least one bipolar junction transistor is coupled to receive the amplified signal of the value proportional to temperature generated by the temperature-compensation amplifier, and wherein the amplified signal is operative to bias the at least one bipolar junction transistor at a bias voltage of a value which is proportional to temperature whereby a current generated at the collector electrode of the at least one bipolar junction transistor is exponentially related to the bias voltage of the base electrode of the at least one bipolar junction transistor, and whereby the current generated at the collector electrode of the at least one bipolar junction transistor comprises the temperature-independent signal which is exponentially related to the input signal.

* * * * *